United States Patent
Gadepally (12)

(10) Patent No.: US 6,329,287 B1
(45) Date of Patent: Dec. 11, 2001

(54) PROCESS FOR MANUFACTURING AN INTEGRATED CIRCUIT STRUCTURE WITH METAL SALICIDE REGIONS AND METAL SALICIDE EXCLUSION REGIONS

(75) Inventor: Kamesh V. Gadepally, San Jose, CA (US)

(73) Assignee: National Semiconductor Corporation, Santa Clara, CA (US)

(*) Notice: Subject to any disclaimer, the term of this patent is extended or adjusted under 35 U.S.C. 154(b) by 0 days.

(21) Appl. No.: 09/430,348

(22) Filed: Oct. 29, 1999

(51) Int. Cl.⁷ .................................................. H01L 21/44
(52) U.S. Cl. ........................ 438/674; 438/634; 438/649; 438/682; 438/683; 438/684; 257/757; 257/768; 257/769
(58) Field of Search .................................. 458/674, 682, 458/683, 684, 533, 558, 584, 586, 630, 649, 651, 655, 664, 249, 301, 342, 364, 542; 257/384, 757, 768, 764

(56) References Cited

U.S. PATENT DOCUMENTS 5,911,114 * 6/1999 Naem ..................................... 438/684
5,970,370 * 12/1998 Besser et al. ......................... 438/586
6,089,659 * 11/1998 Kepler et al. ......................... 438/249
6,136,705 * 10/1998 Blair ..................................... 438/682

OTHER PUBLICATIONS

S. Wolf, *Silicon Processing for the VLSI Era,* vol. I, pp. 388–399 (Lattice Press, 1986).

* cited by examiner

*Primary Examiner*—David Nelms
*Assistant Examiner*—Reneé R. Berry
(74) *Attorney, Agent, or Firm*—Girard & Equitz LLP

(57) ABSTRACT

A process for the formation of metal salicide regions and metal salicide exclusion regions in an integrated circuit (IC) that requires a minimum number of steps and is compatible with standard MOS processing techniques. In the process, an IC structure is first provided. The IC structure includes a plurality of MOS transistor structures with exposed silicon surfaces, such as source regions, drain regions and polysilicon gates. A metal layer (e.g., cobalt, titanium, tantalum, nickel or molybdenum) is then deposited over the IC structure, followed by the formation of a photoresist masking layer on those MOS transistor structures where metal salicide regions are to be formed. The metal layer from those MOS transistor structures where metal salicide exclusion regions are to be formed is then removed, followed by stripping of the photoresist masking layer from those MOS transistor structures where metal salicide regions are to be formed. Metal in the metal layer that is in direct contact with silicon in the exposed silicon surfaces is subsequently reacted to form metal salicide regions.

7 Claims, 3 Drawing Sheets

PROCESS FOR MANUFACTURING AN INTEGRATED CIRCUIT STRUCTURE WITH METAL SALICIDE REGIONS AND METAL SALICIDE EXCLUSION REGIONS

BACKGROUND OF THE INVENTION

1. Field of the Invention

The present invention relates to processes for the formation of an integrated circuits structure and, in particular, to a process for the formation of an integrated circuit that includes metal salicide regions and metal salicide exclusion regions.

2. Description of the Related Art

In Metal-Oxide-Semiconductor (MOS) device manufacturing, self-aligned metal silicide layers (also known as "salicide" layers) are useful in reducing the sheet resistance of polysilicon interconnections, source regions and drains regions, as well as contact resistance. See, for example, Stanley Wolf, *Silicon Processing for the VLSI Era*, Vol. I, 388–399 (Lattice Press, 1986).

FIGS. 1–3 illustrate a conventional process for forming a metal silicide layer over a polysilicon gate, a source region and a drain region of an MOS transistor structure within an integrated circuit (IC). A conventional MOS transistor structure 10 includes a thin gate oxide layer 12 overlying P-type silicon substrate 14 between N-type drain region 16 and N-type source region 18, both of which are formed in P-type silicon substrate 14. A conventional MOS transistor structure 10 also includes a polysilicon gate 20 overlying thin gate oxide layer 12, as well as field oxide regions 22, which isolate MOS transistor structure 10 from neighboring semiconductor device structures (not shown). Gate sidewall spacers 24, typically formed of silicon dioxide and/or silicon nitride, are disposed on the lateral edges of polysilicon gate 20 and thin gate oxide layer 12.

In a conventional metal silicide formation process, a metal layer 28 is deposited over the surface of MOS transistor structure 10, as illustrated in FIG. 2. Metal layer 28 is ordinarily deposited by a multi-directional evaporative or sputtering-based physical vapor deposition (PVD) process or a multi-directional chemical vapor deposition (CVD) process and is, therefore, of essentially uniform thickness over the entire surface of MOS transistor structure 10.

Wherever metal layer 28 is in contact with silicon surfaces (i.e. source region 18, drain region 16 and the polysilicon surface of polysilicon gate 20) the metal is reacted to form a metal silicide layer. The reaction conditions, such as temperature and gaseous ambient, employed for the metal silicide layer formation are selected to foster the reaction of the metal layer with silicon surfaces while impeding the reaction of the metal layer with silicon dioxide or silicon nitride surfaces (i.e. the gate sidewall spacers and field oxide regions).

A selective etch is then used to remove unreacted metal from the surface of the gate sidewall spacers and field oxide regions, as well as any unreacted metal residue still remaining above the source region, drain region and polysilicon gate. The etch is "selective" since it does not remove the metal silicide layer that was formed on the surface of the silicon and polysilicon regions. The result, illustrated in FIG. 3, is a metal silicide layer 32 on the surface of drain region 16, a metal silicide layer 34 on the surface of source region 18 and a metal silicide layer 36 on the surface of polysilicon gate 20.

It can be desireable to form integrated circuits that include both MOS transistors structures with metal salicide layers (i.e., metal salicide regions) and MOS transistor structures without metal salicide layers (i.e., metal salicide exclusion regions). For example, it is often beneficial to form input/output (I/O) MOS transistor structures without metal salicide layers in order to provide a relatively high resistance I/O path for electrostatic discharge (ESD) protection.

Conventional processes for the formation of IC structures with metal salicide regions and metal salicide exclusion regions involve a series of steps that form a layer of silicon dioxide over MOS transistor structures where metal salicide exclusion regions are to be formed, prior to the deposition of a metal layer. This series of steps includes depositing a silicon dioxide layer on an integrated circuit structure, forming a photoresist masking layer on the silicon dioxide layer, removing the silicon dioxide layer from the MOS transistor structures where metal salicide regions are to be formed, and then stripping the photoresist masking layer. This series of steps is followed by the deposition of a metal layer and the formation of metal salicide regions.

A drawback of conventional processes for the formation of IC structures with metal salicide regions and metal salicide exclusion regions is the potential for the step of removing the silicon dioxide layer to damage the MOS transistor structures where metal salicide regions are to be formed. For example, if the silicon dioxide layer is removed from the MOS transistor structures where metal salicide regions are to be formed using an HF acid or buffered oxide etchant (BOE), then there is a potential for the HF acid and BOE to attack gate sidewall spacers formed of silicon dioxide. In addition, the conventional processes are relatively complicated and requires many steps since they involve the deposition of a silicon dioxide layer, the formation of a masking layer, the removal of the silicon dioxide layer and the stripping of the photoresist masking layer.

Still needed in the field is a process for manufacturing an integrated circuit structure with a metal salicide region(s) and a metal salicide exclusion region(s) that is simple, requires a minimum number of steps and does not subject MOS transistor structures where metal salicide regions are to be formed to damage by a silicon dioxide layer removal process step.

SUMMARY OF THE INVENTION

The present invention provides a process for the formation of metal salicide regions and metal salicide exclusion regions during integrated circuit (IC) manufacturing. The process requires a minimum number of steps, does not subject MOS transistor structures to a silicon dioxide removal process step, is compatible with standard MOS processing techniques and provides for the formation of metal salicide regions (such as source regions, drain regions or polysilicon gates) on predetermined MOS transistor structures, while also providing for the formation of metal salicide exclusion regions on other predetermined MOS transistor structures in an IC.

Processes according to the present invention include first providing an IC structure that includes a plurality of MOS transistor structures with exposed silicon surfaces (such as source regions, drain regions, and polysilicon gates). A metal layer (e.g., cobalt, titanium, tantalum, nickel or molybdenum) is then deposited over the IC structure. If a cobalt layer is used as the metal layer, then a capping layer (e.g., titanium or titanium nitride) is subsequently deposited thereon. A photoresist masking layer is then formed on those MOS transistor structures where metal salicide regions are to be formed, followed by removal of the metal layer from those MOS transistor structures where metal salicide exclusion regions are to be formed. Next, the metal layer (as well as the capping layer, if any) is removed from those MOS transistor structures where metal salicide exclusion regions are to be formed, followed by stripping of the photoresist masking layer from those MOS transistor structures where metal salicide regions are to be formed. Metal in the metal layer that is in contact with exposed silicon surfaces is then reacted to form metal salicide regions.

As is evident from the detailed description below, the key benefits of the formation of metal salicide regions and metal salicide exclusion regions in processes according to the present invention are two fold. First, the removal of a metal layer from those MOS transistor structures where metal salicide exclusion regions are to be formed can be accomplished using relatively simple photoresist masking layer formation and metal layer removal processes, while leaving a metal layer on those MOS transistor structures where metal salicide regions are to be formed intact. Second, steps of silicon dioxide layer deposition on an IC structure and subsequent silicon dioxide layer removal from the MOS transistor structures where metal salicide regions are to be formed are completely eliminated. The elimination of these steps not only reduces the required number of process steps to a minimum, but also avoids subjecting the precursor of the metal salicide regions to attack by HF acid or BOE.

BRIEF DESCRIPTION OF THE DRAWINGS

A better understanding of the features and advantages of the present invention will be obtained by reference to the following detailed description that sets forth illustrative embodiments in which the principles of the invention are utilized, and the accompanying drawings of which.

DETAILED DESCRIPTION OF THE INVENTION

Figure 1:
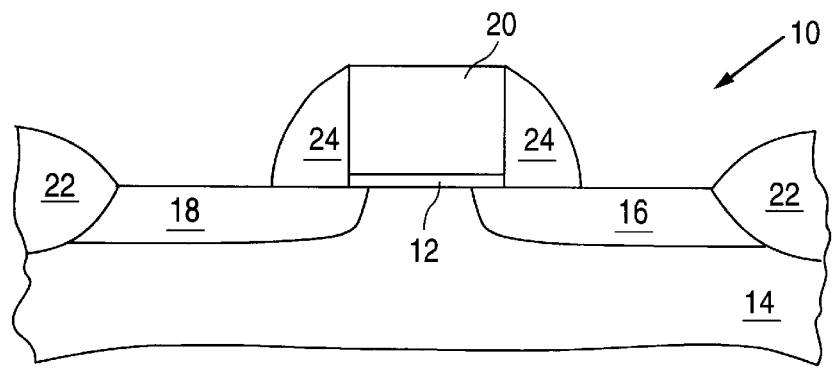
FIG. 1 is a cross-sectional view illustrating a conventional MOS transistor structure prior to the deposition of a metal layer.
Figure 2:
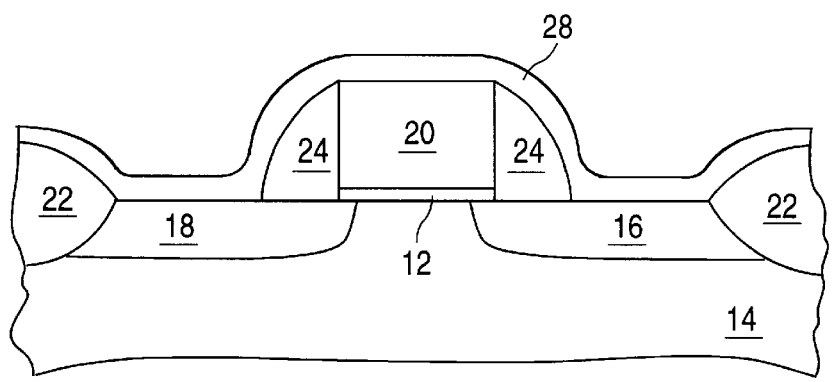
FIG. 2 is a cross-sectional view depicting a conventional MOS transistor structure after deposition of a metal layer.
Figure 3:
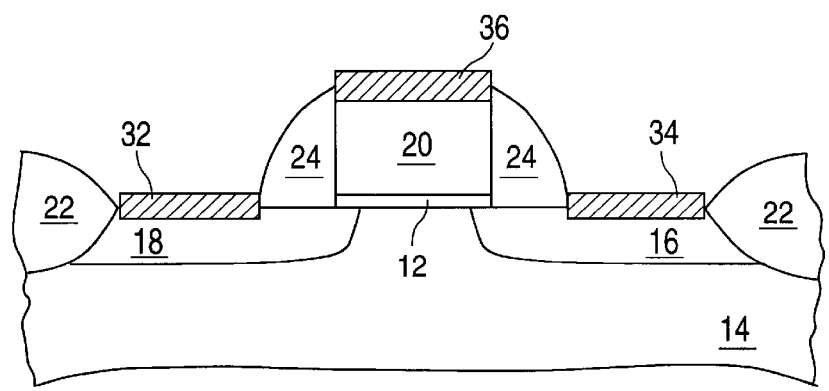
FIG. 3 is a cross-sectional view showing a conventional MOS transistor structure after reacting a metal layer with the silicon surfaces of the source and drain regions and the polysilicon surface of the polysilicon gate.
Figure 4:
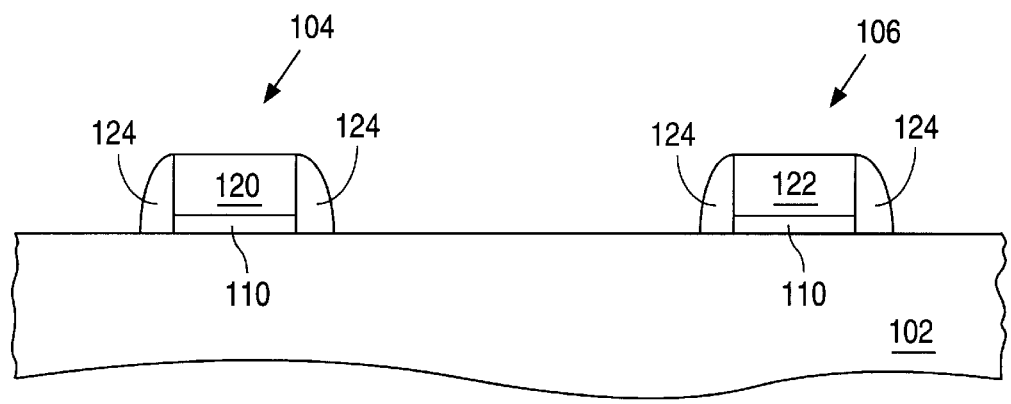
FIGS. 4–9 are cross-sectional views illustrating stages in a process in accordance with the present invention.

FIGS. 4–9 illustrate stages of a process for the formation of a metal salicide region(s) and a metal salicide exclusion region(s) on an IC according to the present invention. An IC structure 100 with silicon substrate 102 of a first conductivity type, typically P-type, and a plurality of MOS transistor structures, such as MOS transistor structures 104 and 106 is initially provided as shown in FIG. 4. Each MOS transistor structure includes a gate oxide layer 110 (typically between 35 and 200 angstroms thick) overlying silicon substrate 102. The gate oxide layer 110 of each MOS transistor structure lies between a source region (not shown) and a drain region (not shown), both of which are located in silicon substrate 102. One of skill in the art will recognize that the source regions and the drain regions can be implanted with dopant atoms (e.g., boron atoms, phosphorus atoms or arsenic atoms) either before or after processes in accordance with the present invention have been performed. Silicon gates 120 and 122 (typical thickness being in the range between 1500 and 4000 angstroms) overly the gate oxide layer 110 of MOS transistor structures 104 and 106, respectively. Silicon gates 120 and 122 can be made from either polysilicon or amorphous silicon layers. Each of the MOS transistor structures 104 and 106 also includes gate sidewall spacers 124 which abut the lateral surfaces of the silicon gates 120 and 122 and the gate oxide layers 110. These gate sidewall spacers are made, for example, of silicon nitride, silicon dioxide including TEOS based silicon dioxide, silicon oxynitride or a combination thereof and have a typical width in the range of 1000 to 2000 angstroms.

If desired, the surface of IC structure 100 can be prepared for the subsequent deposition of a metal layer 126 (as described below) in a conventional manner, such as by the use of HF-based solutions or standard RCA solutions, to remove unwanted silicon dioxide layers (e.g., native oxide layers) covering the source regions, drain regions, or the polysilicon gates, thereby insuring the metal layer's direct contact with the underlying silicon. HF-based solutions can be used at a $H_2O$ to HF concentration of 100:1 for 20 seconds at 25° C., followed by 16 minutes in a $H_2SO_4/H_2O_2$ mixture at 130° C. The target oxide layer removal is typically 50–100 angstroms.

Figure 5:
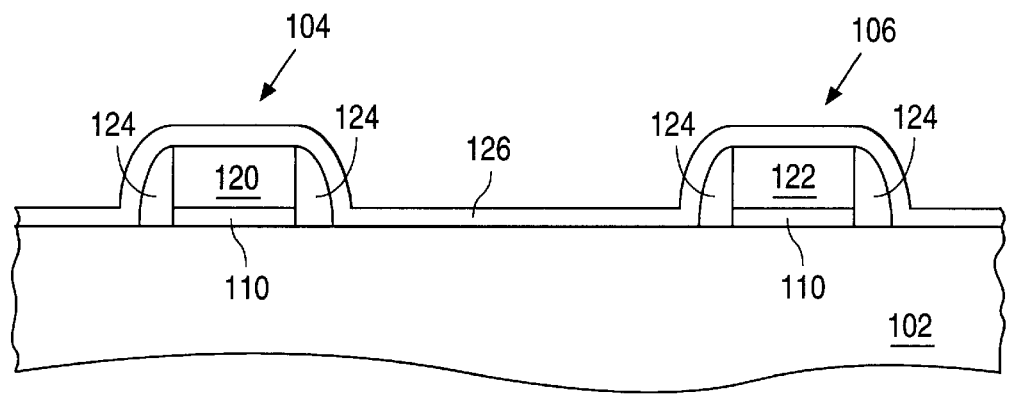

Next, metal layer 126 is deposited over the IC structure completely covering the source regions (not shown), the drain regions (not shown), the silicon gates 120 and 122, and the gate sidewall spacers 124. The resultant structure is illustrated in FIG. 5. A layer of either cobalt, titanium, nickel or molybdenum can be used as a metal layer, although a cobalt layer or a titanium layer is more commonly used. If a cobalt layer is used, then a titanium or titanium nitride capping layer (not shown, typically 50 to 200 angstroms in thickness) is deposited on the cobalt layer using conventional sputtering techniques. The metal layer 126 thickness is preferably in the range of 150 to 500 angstroms although thicker and thinner metal layers can be employed. Metal layer 126 can be deposited by any process known in the art, for example, sputtering or chemical vapor deposition.

Figure 6:
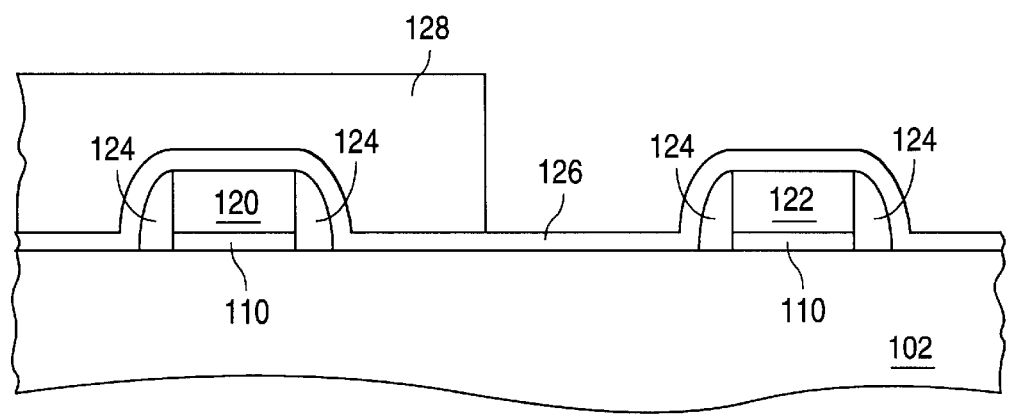
Figure 7:
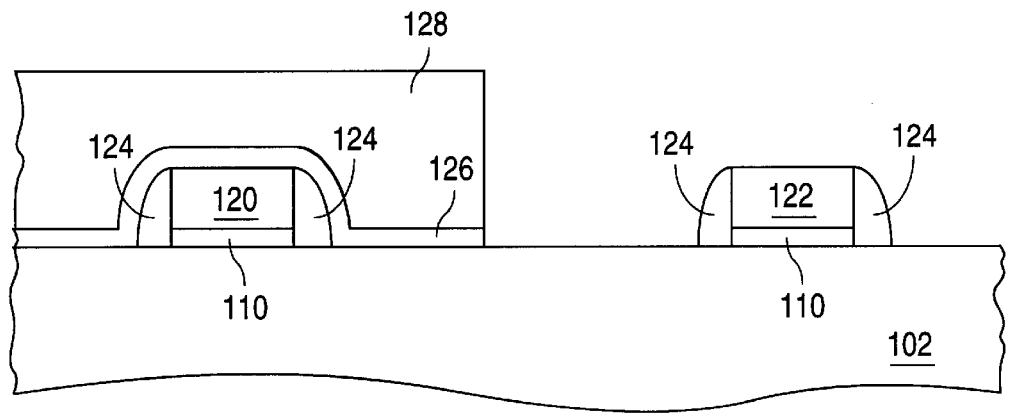

Next, a photoresist masking layer 128 is formed on those MOS transistor structures where metal salicide regions are to be made, leaving those MOS transistor structures where metal salicide exclusion regions are to be made exposed. The resultant structure is illustrated in FIG. 6. A typical thickness of the photoresist masking layer is 10,000 angstroms. Formation of the photoresist masking layer is accomplished by using standard photolithographic techniques. The exposed metal layer (i.e., the metal layer on those MOS transistor structures where metal salicide exclusion regions are to be formed) is then removed by using either a plasma dry etch or a wet chemical strip, as shown in FIG. 7. Typical wet chemical strip conditions for a cobalt layer are a $H_2SO_4/H_2O_2$ mixture with a $H_2SO_4:H_2O_2$ concentration ratio in the range of 2:1 to 6:1 at room temperature, while for a titanium layer a $NH_4OH$ solution with a chemical strip time of up to 30 minutes can be used.

Figure 8:
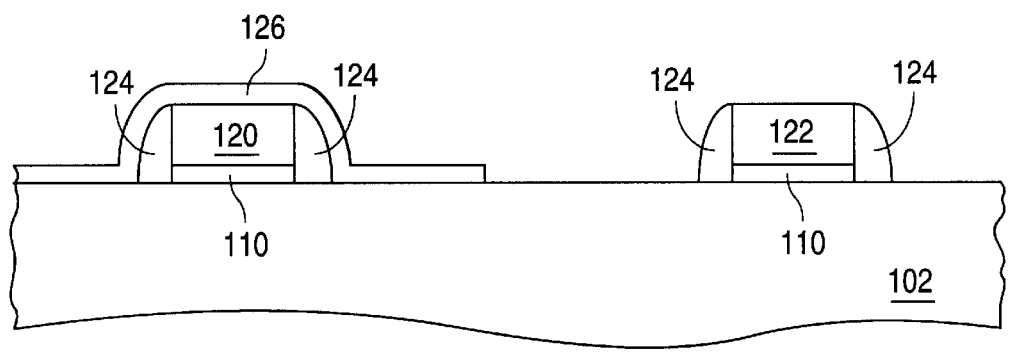
Figure 9:
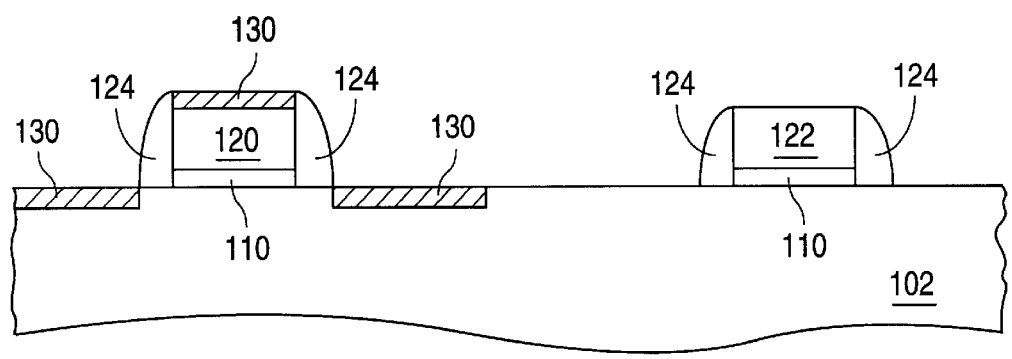

Next, the photoresist masking layer 128 is removed using standard techniques, such as plasma ashing or wet chemical stripping. The resultant structure is illustrated in FIG. 8. Metal in the metal layer 126 that is in direct contact with silicon in the silicon substrate 102, the source regions (not shown), the drain regions (not shown), and silicon gate 120 is then reacted to form metal silicide layers (i.e., CoSi, if a cobalt layer is used) on these regions. The metal-silicon reaction can be conducted using procedures well known to those skilled in the art. Typical procedures employ elevated temperatures, around 450–535° C., in nitrogen for up to 65 seconds, in order to foster the silicide formation and the reactions are normally conducted in a rapid thermal processor (RTP). If a cobalt layer is used, the reactions are typically conducted in a RTP at around 450–500° C. for 5 seconds. Unreacted metal from the metal-silicon reaction is subsequently removed using a conventional selective wet etch, such as a mixture of sulfuric acid and hydrogen peroxide, or a mixture of phosphoric acid, acetic acid, nitric acid and hydrogen peroxide. A second thermal step is then used to convert the metal silicide (e.g., cobalt silicide [CoSi], if a cobalt layer is used) layers to metal salicide (e.g., cobalt salicide [$CoSi_2$], if a cobalt layer is used) layers. The resultant structure is illustrated in FIG. 9. This second thermal step can be conducted in an RTP at 650–850° C. for 30 seconds to 2 minutes in an $N_2$ ambient. If a cobalt layer is used, the typical second RTP conditions are a temperature of around 700° C. for 30 seconds.

Processes according to the present invention can form both metal salicide regions and metal salicide exclusion regions in an integrated circuit with a minimum number of required steps and without subjecting any MOS transistor structures to a silicon dioxide removal process step. By eliminating a step of silicon dioxide layer deposition on an IC structure, as well as a subsequent step of silicon dioxide layer removal from those MOS transistor structures where metal salicide regions are to be made, required number of steps in such processes is significantly reduced. More importantly, the elimination of the silicon dioxide layer removal step protects the precursor of the metal salicide regions from being subjected to attack by HF acid or BOE. Instead of employing silicon dioxide layer deposition/removal steps, processes according to the present invention involve the removal of a metal layer from those MOS transistor structures where metal salicide exclusion regions are to be formed, while leaving a metal layer on those MOS transistor structures where metal salicide regions are to be formed intact. Such removal of the metal layer is accomplished by using relatively simple photoresist masking layer formation and metal layer removal processes.

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. A method for forming metal salicide regions and metal salicide exclusion regions during the manufacturing of an integrated circuit (IC), the method comprising the steps of:
   (a) providing an IC structure including a plurality of MOS transistor structures, the plurality of MOS transistor structures having exposed silicon surfaces;
   (b) depositing a metal layer on the IC structure;
   (c) forming a photoresist masking layer on those MOS transistor structures where metal salicide regions are to be formed;
   (d) removing the metal layer from those MOS transistor structures where metal salicide exclusion regions are to be formed;
   (e) after step (d), stripping the photoresist masking layer; and
   (f) after step (e), reacting metal in the metal layer with silicon in the exposed silicon surfaces to form metal salicide regions.

2. The method of claim 1 further including the step of removing a native oxide layer from the plurality of the MOS transistor structures between the providing step and the depositing step.

3. The method of claim 1 wherein the depositing step includes depositing a metal layer selected from the group consisting of cobalt, titanium, tantalum, nickel and molybdenum.

4. The method of claim 1 wherein the depositing step includes depositing a metal layer with a thickness in the range of 150 to 500 angstroms.

5. A method for forming cobalt salicide regions and cobalt salicide exclusion regions during the manufacturing of an integrated circuit (IC), the method comprising the steps of:
   (a) providing an IC structure including a plurality of MOS transistor structures, the plurality of MOS transistor structures having exposed silicon surfaces;
   (b) depositing a cobalt layer on the IC structure;
   (c) depositing a capping layer on the cobalt layer;
   (d) forming a photoresist masking layer on those MOS transistor structures where metal salicide regions are to be formed;
   (e) removing the capping layer and the cobalt layer from those MOS transistor structures where cobalt salicide exclusion regions are to be formed;
   (f) after step (e), stripping the photoresist masking layer; and
   (g) after step (f), reacting cobalt in the cobalt layer with silicon in the exposed silicon surfaces to form cobalt salicide regions.

6. The method of claim 5 wherein the step of depositing a capping layer includes depositing a capping layer selected from the group consisting of titanium and titanium nitride.

7. The method of claim 5 wherein the depositing steps include depositing a cobalt layer with a thickness in the range of 150 to 500 angstroms and depositing a capping layer with a thickness in the range of 50 to 200 angstroms.

* * * * *